United States Patent [19]

Van Brunt

[11] Patent Number: 4,527,249
[45] Date of Patent: Jul. 2, 1985

[54] SIMULATOR SYSTEM FOR LOGIC DESIGN VALIDATION

[75] Inventor: Nicholas P. Van Brunt, White Bear Lake, Minn.

[73] Assignee: Control Data Corporation, Minneapolis, Minn.

[21] Appl. No.: 436,162

[22] Filed: Oct. 22, 1982

[51] Int. Cl.³ .................. G06G 7/48; G06F 15/16
[52] U.S. Cl. .................. 364/578; 324/73 R; 364/481; 371/23
[58] Field of Search .......... 364/481, 716, 578; 371/15, 21, 25, 16; 377/70, 78, 81; 324/73 R, 371

[56] References Cited

U.S. PATENT DOCUMENTS

| | | | |
|---|---|---|---|
| 4,293,919 | 10/1981 | Dasgupta et al. | 377/70 |
| 4,306,286 | 12/1981 | Cocke et al. | 364/200 |
| 4,365,334 | 12/1982 | Smith et al. | 324/73 R |
| 4,428,060 | 1/1984 | Blum | 377/78 |
| 4,450,560 | 5/1984 | Conner | 371/25 |

OTHER PUBLICATIONS

Angus R. McKay, "Comment on 'Computer-aided Design: Simulation of Digital Design Logic,'" *IEEE Transactions on Computers*, Sep. 1969, p. 862.
R. Barto et al., "A Computer Architecture for Digital Logic Simulation," *Electronic Engineering*, Sep. 1980, p. 35.

*Primary Examiner*—Errol A. Krass
*Assistant Examiner*—Heather R. Herndon
*Attorney, Agent, or Firm*—William J. McGinnis; Joseph A. Genovese

[57] ABSTRACT

A hardware network or system is disclosed for testing LSI and VLSI logic device design and system design by simulation utilizing individual gate functions. The simulator system uses switching logic, random access memory, and a state table device to simulate particular test routines to test device design with functions which may appear in random or semi-random sequence.

5 Claims, 7 Drawing Figures

SIMULATOR SYSTEM FOR LOGIC DESIGN VALIDATION

FIELD OF THE INVENTION

This invention relates to a test system for high speed testing of system design or of LSI (Large Scale Integrated Circuit) and VLSI (Very Large Scale Integrated Circuit) device design by simulation. The system may be adapted to operate through a host computer processor on communication network remote from the simulator system. Presently general purpose computers simulate design using computer programs and the present invention is a hardware simulator system to simulate the functioning of a given logic design to verify that design.

PRIOR ART

Known to applicant are a number of prior art publications. Two particularly pertinent publications are:
R. Barto et al., "A Computer Architecture for Digital Logic Simulation," *Electronic Engineering*, September 1980, page 35 and Angus R. McKay, "Comment on 'Computer-aided Design: Simulation of Digital Design Logic,'" *IEEE Transactions on Computers*, September 1969, P. 862.
The Barto article shows a table driven logic cycle oriented hardware design relevant to the present application. The McKay letter reports test results on a hardware system.

BACKGROUND OF THE INVENTION

The semiconductor industry continues to progress by providing the potential to place increasingly large numbers of devices or logic gates on a chip at an average rate approaching doubling each year. Similarly, chip packaging technologies are developing which dramatically increase the density of chips which can be packed in the various physical packaging modules. These effects produce a continuous flow of improved system implementation possibilities which are so dramatic that they are difficult to relate or compare to previous designs and design methodologies.

Unfortunately these new technologies require a continuous flow of improved design techniques and designer tools in order to attack the various complexity management problems they bring along. Specifically, design verification, physical layout and interconnection and test generation must be performed on the chips and other physical modules. It has been determined analytically and empirically that the magnitude of these tasks grows about exponentially with the number of devices per chip or module. The present invention relates to the design verification portion of the problem.

When considering the problem of verifying the design of a single LSI or VLSI chip, there are two analogies that can be drawn. The first is fairly obvious and relates to the problem of verifying a complete central processor unit or CPU to that of verifying a chip. Verification of a new design of complexity containing about 100,000 logic gates is a known task. The smaller Control Data Corporation CYBER 170 machines are of this design magnitude. The verification process consists of running thousands of lines of diagnostic software followed by the machine's operating system processing real application software. The result of this verification is typically a list of design changes which can easily number in the hundreds.

People are currently designing 32 bit CPU chips, using today's processing technology, which are within half this complexity. Verification of these chips is done using a simulator computer program, which emulates as closely as possible the detailed operation of these chips in an attempt to uncover design problems before the chips are fabricated. It seems that the number of test cases required to verify the single chip CPU must approach that which was run on complete computer designs of nearly the same complexity if an equivalent level of verification is to be obtained.

A computer alogorithm is presently in use as a high performance simulator and which provides error free designs at a rate of 9 good designs per 10 chips. At this point, the second analogy can be drawn which relates the verification problem to that of the physical silicon chip processing yield. For a given maufacturing process, there is a given statistical fault density, as stated in faults per unit area. The yield of a chip with a given area is a complex formula, but a primary effect is that the ratio of faulty chips to total chips per silicon wafer grows exponentially with chip area. The design "process" currently produces a "yield" of 90 percent of an "area" of 250 gates per chip. Using the same design "process" and increasing the "area" to 5000 gates results in a "yield" that approaches zero. This implies that the design process which relies heavily on the use of the simulator is in need of dramatic improvement if we wish to deal effectively with chips of this complexity. Analogies are seldom totally accurate, but even if they are only partially correct, the effects predicted are rather severe.

The current state of the art in simulation technology allows logic simulation to operate at a rate of 90,000 logical switching events per second. At this rate, it would take several days of continuous simulation execution to simulate one second of real activity in a modest sized CPU. Furthermore, this simulation requires a very large computer system to execute at this rate. Such a system is expensive and rather inconvenient to use due to the batch execution environment of the simulator program and the commonly required sharing of the computer resource. This inconvenience is often underrated, because people have learned to accept it, seeing no other options. It is believed that this has a significant affect on design time and designer creativity in the real world.

Simulator execution rate is the major technical challenge due to the need to run very large numbers of test cases for final verification of logic network or chip design and to allow an interactive response rate for the same computer for smaller jobs at the same time. A truely interactive response would allow a simulator system to be used as a design optimization tool if coupled to a graphic logic entry system.

Problems also exist in trying to apply simulators developed for bipolar semiconductor technologies to the new MOS technologies. These simulators tend to be short on features needed for MOS. A list of desirable features for MOS simulation is listed below along with the ability of current Control Data Corporation simulation systems to handle them:

| FEATURE | SYSTEM | | |
| --- | --- | --- | --- |
| | ASSIST | LSISIM | AFS |
| Rise & Fall Delay | Yes | No | No |
| Bi-directional Signals | Yes | No | No |

|                          | SYSTEM   |        |     |
|--------------------------|----------|--------|-----|
| FEATURE                  | ASSIST   | LSISIM | AFS |
| Device Level Simulation  | Limited  | No     | No  |
| Device Level Fault Models| —        | —      | No  |

Device level simulation is the ability to model individual transistors (NMOS, PMOS, GAAS) and resistors to provide complete and final verification of design and interconnection routing and to provide the flexibility needed for full custom designed technologies. Additional simulation states are needed to model transistors. Also, each state must carry a relative strength factor to allow dynamic charge effects, pull-ups and variable device sizes to be modeled.

SUMMARY OF THE INVENTION

An object of this invention is to produce a simulation system with the features needed to accommodate logic design technology having a performance increase many times that of existing systems. The present logic simulator system should provide an interactive simulation capacity with response times of only a few seconds or minutes as seen by the user.

A speed up of this magnitude is not believed to be possible either with improved software algorithms, coding techniques for models or faster host processors of the general purpose type. Speed ups are possible by reducing simulation features even further than the present levels or by ignoring processing time effects entirely, but this is not accomplishing the desired task.

The only solution to this problem is a dedicated piece of special purpose simulator hardware which executes a simulation model directly. The standard event driven simulation algorithm with discrete time steps on a continuous time wheel is the most stable, well accepted and versatile simulation algorithm in use. It can be extended to provide the MOS features desired and seems to lend itself well to dramatic speed ups through direct hardware implementation. The hardware simulator will be totally table driven and its capacity should be extendable over a very large range.

Communication between a host processor and the simulator should be over a data channel with at least a seven million bits per second rate. A higher rate would be desirable with a likely limit of 10 million bits per second resulting from simulator I/O band width limitation. The hardware should support a system configuration in which the simulator is linked to a host machine which handles the central data base and the rest of a computer aided design system. The users would communicate through the host to the simulator.

The simulator hardware could also function in a distributed system or stand alone in conjunction with a number of engineering work stations. In this mode, the full cost and performance potential could be realized.

A local network approach is one logical choice for the communication link between the simulator and the other system components. The Control Data Corporation Loosely Coupled Network for example has more than adequate performance and provides the flexibility needed to interface to various hosts or work station configurations which could be conceived now or in the future.

Present simulation systems use front and back end routines which provide the user interface and pass data to and from the simulator table structures. All information needed to perform the simulation is contained in tables loaded by the front-end and all results are contained in tables which are translated and displayed by the back end. Communication with the hardware simulator would be accomplished by way of the local network to and from a similar set of tables. The front and back end processing would still be done in software outside the hardware simulator. This allows flexibility in the user interface. A desirable approach is to restructure the front-end so that it only re-compiles the portions of the simulation tables which are affected by a particular design change. It this way, once a design has been entered, the numerous additions, deletions and modifications can be made as they are needed and can be tested rapidly without having to re-compile the total set of tables each time as is currently done in a software system.

The simulator according to the present invention is comprised of a number of random access memories which perform the table functions. In particular, a model table memory is provided to contain the model information describing the design of the particular chip or logic network which is to have its design verified. Further, a state table memory is provided which is used to contain information about the state or condition of each element of the chip or network as contained in the model table. In terms of the logic design of a chip, its gate interconnection description can be referred to as its net list. Thus, the model table contains a description of all possible elements in the chip in terms of the logic function. The net list table contains a description of the interconnection and design functions within the chip design under test and the state table contains a list of the present state of each element. The simulator works by dividing each unit of normal cycle time of the chip into numerous time slices on the timing wheel theory. The simulator looks at each time slice to determine if a function generated causes any changes of state to any element identified in the net list according to the model table functions. If any net list element changes its state, then the state table memory is updated with this change in state. The process proceeds in functional order from input to output in the chip or network design which is being verified.

IN THE FIGURES

FIGS. 1A and 1B are intended to be placed in left and right relationship and show a block diagram embodiment of a non-event driven simulator system according to the present invention.

FIG. 3 shows a system design of an embodiment of an event-driven simulator system according to the present invention.

DESCRIPTION OF THE PREFERRED EMBODIMENT

Figure 1B:
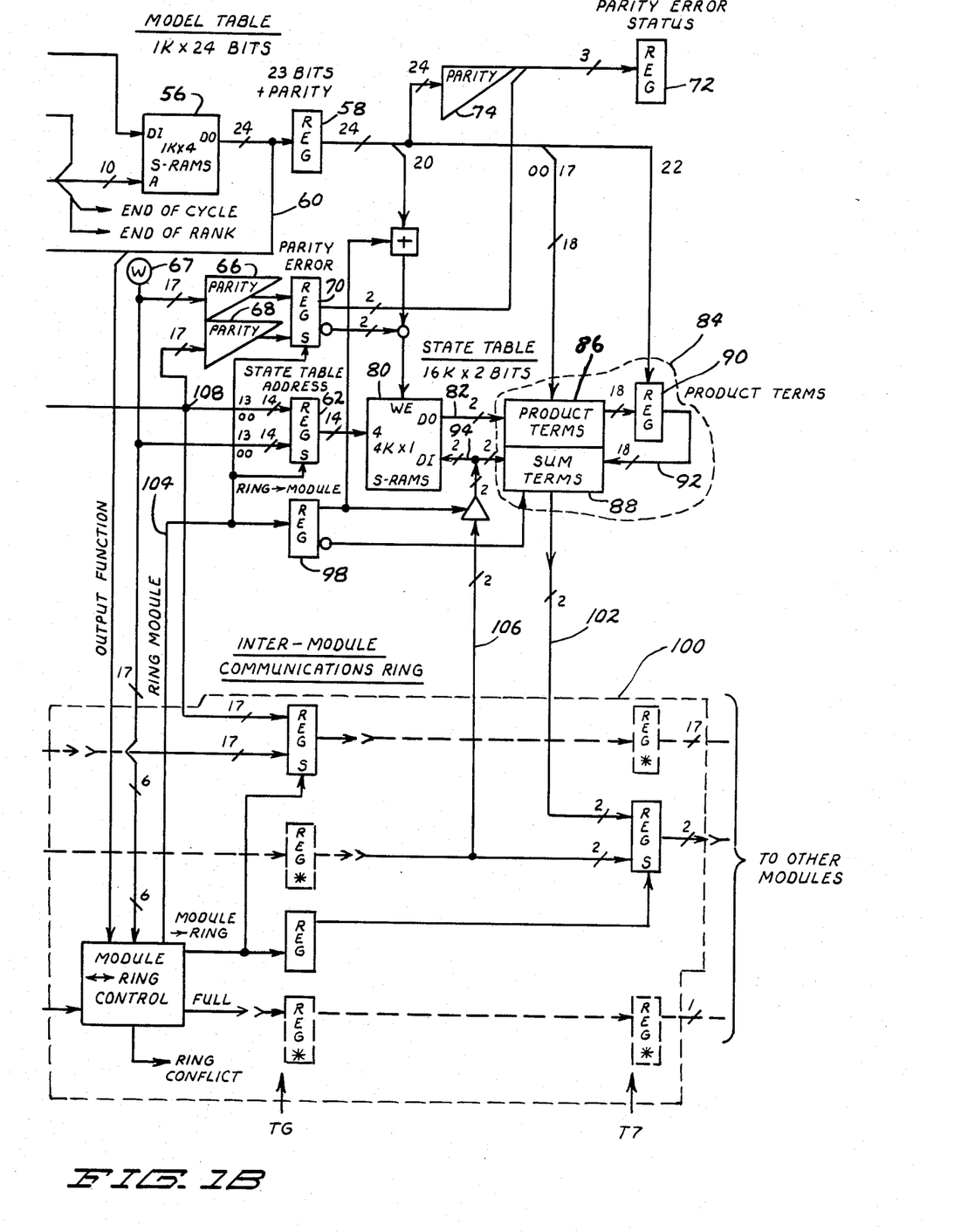

Referring now to FIGS. 1A and 1B, a simulator system 10 according to the present invention is shown for non-event driven simulation of an LSI device or logic design. The drawing in FIG. 1 is organized left to right in a timing sequence showing the timing of events in the simulator. The so called "net list" which is a comprehensive encoded description of the chip device or logic design to be verified and which is listed by gate type and interconnection requirements is supplied from an input source 12 such as a general purpose computer system or host processor to a "net list" write data register 14. A "net list" address list register 16 operates simultaneously with the "net list" write data register 14 to keep track of the addresses of the particular "net list" write data items. An address incrementor 18 updates the address of the "net list" address register 16. "Net list" write data is supplied on a write data bus 20 which is connected to a plurality of "net list" dynamic RAM memories 22, 24, 26 and 28 each of which, for example, has 16K bits of memory and is one bit wide. The output of the "net list" address register 16 is supplied to a two-to-four decode logic device 30, the output of which is provided on a write enable bus 32 connected to the dynamic RAM memories 22, 24, 26 and 28. The decode device 30 controls the addressing of the "net list" write data into the memories so that the memories are addressed sequentially in a rotating sequence. The decode device 30 also has an output address bus 34 which is divided into various bits and broadcast to various parts of the system 10. Some of the bits are divided out onto an address bus 36 which is connected as an address input to memories 22, 24, 26 and 28 so that an address portion is always available to each of the memories. It is the write enable control bus 32 that controls the functioning of the memories. Another portion of address bus 34 is divided out as a state table and sweep address bus 38 and supplied to a sweep model register 40, which will be explained in greater detail later.

The outputs of the memories are each connected to a "net list" read data register. Memory 22 is associated with "net list" data register 42, memory 24 is associated with register 44, memory 26 is associated with register 46 and memory 28 is associated with register 48. The outputs of registers 42, 44, 46 and 48 are all connected to a read bus 50 which is connected with the sweep model table register 40 and also with the model table address register 52. The sweep model table address register 52 is incremented by an address incrementor 54 during operation.

Output of the sweep model table address register 52 is connected into a model table 56. The model table 56 contains the information about the function to be performed by the particular logic gates which are used in the particular circuit design. That is, when the particular device to be simulated is written into the system, the various gates employed are defined by the functions which they perform and these functions are correlated in the model table 56. Thus, when a particular gate name or device type is called up out of the "net list" memories 22, 24, 26 and 28, the model table associates the logic function performed by the gate or device with that particular gate or device and provides an appropriate output to the model table read data register 58 and to the model table output bus 60.

The model table output bus 60 is provided as an input to the sweep model table register 40. The operation of this simulation device is to trace a logical function through a particular logic network. Thus, register 40 has stored within it, for particular model elements, the logical function performed, the current address within the logic gate device to be simulated and the particular logic gate that is being tested. All of this information is combined to produce a change of state information code in the register 40 and this output information is provided to a state table address register 62. The write information from the external source 12 driving the simulator system provides information to the model table write data register 64 which controls the addressing of the model table 56.

At this point it would be appropriate to explain that various parity generating networks 66 and 68 operate on the data in the system to provide a parity checking function which is input to parity error register 70 for checking purposes. The output of parity error register 70 is output into a parity error status register 72 in conjunction with the output of an additional parity generating network 74. These parity generating techniques are comparatively standard and need not be explained further.

The output of the state table address register is connected to a state table static RAM memory 80. The state table static RAM memory is a 16K by 2 bit wide configuration in this embodiment of the invention. The address information is provided on a 14 bit wide bus from the state table address register 62. The data output of memory 80 is provided on bus 82 into a logical evaluation device or processor 84, as shown by the dotted line. The logical evaluation processor 84 contains a product terms logical function unit 86 and a sum terms logical function unit 88. The output of the product terms logical function unit 86 is connected to register 90 which has as an output a bus 92 which provides the input to the sum terms logical function unit 88. The output of the sum terms logical function unit 88 is provided on a bus 94 as the data input to the state table memory 80. The addressing control for the product terms evaluation processor 86 and the sum terms processor 88 is provided as an output from the model table read data register 58. The control for register 90 is also provided as another output from register 58.

The function of the state table memory 80 is to take the present status of the device or design under simulation and provide that status to the product terms evaluator 86. The product terms evaluator 86 receives information about the function to be performed and performs that operation logically and then determines the new state of the particular gate or element and provides that state information back as updated information to the state table memory 80.

The overall purpose of the non-event driven simulator embodiment shown in FIGS. 1A and 1B is to take data that has been preprocessed by the host processor 12 and bring that into several inputs of the non-event driven simulator. Register 14 brings in the "net list" data. Register 64 brings in the model data and bus 67 brings in the state table address data. These three data inputs set up the logic event simulator system 10 with input conditions so that it can now perform its operation. The simulator system 10 performs its intended function under control of the memory and clock control logic 96 which is also connected with host processor 12 for control purposes. The simulation process is functionally driven mainly by the logical evaluation processor 84.

In this configuration, data is processed by the product term logical processor 86 and the sum term logical processor 88 by performing Boolean operations on the input data stream in such a fashion as to create a resultant new state of the simulated logic element. The product term element 86 is logically a configuration of AND gates and the sum term element 88 is a combination of OR gates such that any Boolean function can be performed with this generalized logic evaluator network or processor 84.

The entire simulation process that has been discussed to this point is meant to be broken down into different size problems. The logic that is then discussed would perform a certain magnitude of simulation on a given amount of logic. To extend this function to larger problems with larger "net lists," then the intermodule communication ring logic comes to play. This logic would allow multiple copies of the simulation hardware system to interact under control of the host processor to perform this larger simulation job for different logic elements at the same time. The prime input to the logic that has been described is the external state register 98 which would feed data from other portions or other copies of this hardware simulation system into the subset that is currently acting on the data.

The intermediate communication ring logic network 100 allows multiple copies of the hardware simulator to communicate with one another to perform large simulation jobs. The intermodule communication ring interacts with the one copy of the hardware simulator by receiving output functions from the model table from bus 60. The ring system 100 also receives state table address data from bus 67 and it receives pin state data from logical evaluator 84 via bus 102.

The intermodule communication ring 100 also delivers data to each copy of the hardware simulation logic via ring module bus 104 and pin state data via bus 106. Additionally, the intermodule communication ring, during operation of the simulator would receive the current state table address via bus 108.

Certain portions of the intermodule communication ring logic are contained on each copy of the hardware simulator system. This logic is then duplicated and interconnected via buses to allow each copy of the hardware simulator system to communicate with other copies of the hardware simulator system when performing operations on a large simulation problem.

Figure 2A:
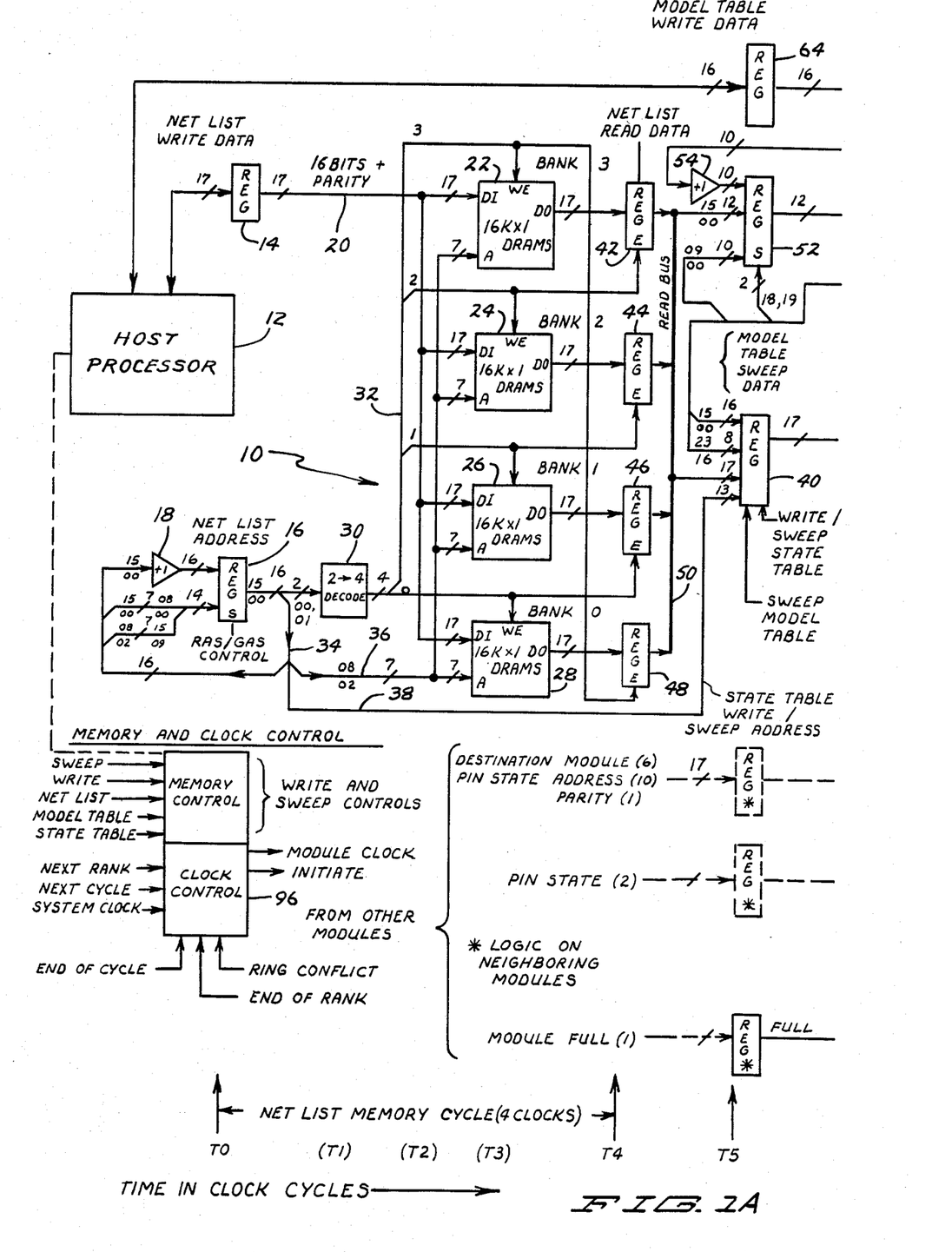
FIGS. 2A and 2B are intended to be placed in top and bottom relationship, respectively, and show another embodiment of a non-event driven simulator system according to the present invention.
Figure 2B:
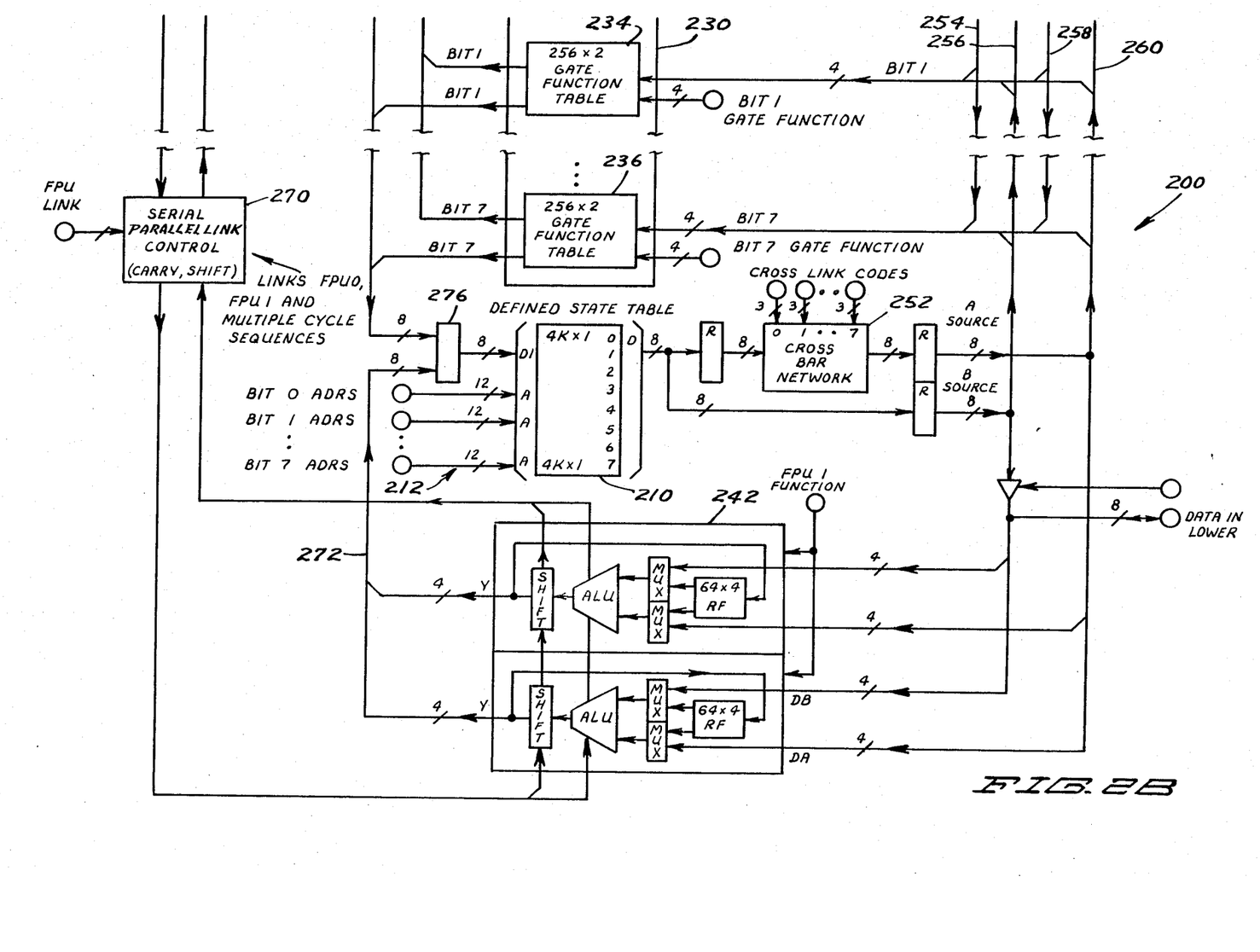

Referring now to FIGS. 2A and 2B, another embodiment 200 is shown of the present simulator system invention. This embodiment is adapted as a Boolean oriented simulator design which does not explicitly keep track of timing events within a logic design to be simulated and verified but merely keeps track of logic levels in the logic being simulated. A defined state table 210 receives a plurality of inputs on lines 212 and represents storage space for keeping track of logical "0" or "1" states of the 8 gate inputs as provided on the inputs 212. These inputs may be provided from a host processor 12, as shown in the embodiment of FIGS. 1A and 1B. An undefined state table 220 provides storage base for keeping track of when a particular gate input is in an undefined logic condition as based on the inputs on address input lines 222. An undefined logic condition would be at the time when a gate is about to switch from one condition to another or is still settling in a condition having just switched. Another example of an undefined condition is when the inputs to the particular gate are not yet known because they are settling from an operation elsewhere in the device under test.

A gate processing unit system 230 is provided having a plurality of individual gate function tables 232, 234 and so on to provide a gate function table for each bit of an 8 bit address where not all gate function tables are shown but ending with gate function table 236 for bit 7. The gate processing unit consists of 8 special purpose logical processor units which determine simple gate outputs given simple input logic functions of the applied inputs. A pair of function processing units 240 and 242 are provided as microprocessor slices which, in this embodiment consist of two 4 bit microprocessor slices connected to make an 8 bit processor slice, perform the function processing unit process. These function processing units accomplish a higher intelligence processing function which can simulate larger block functions within the chip designed to be verified and determine gate outputs given complex logic functions of applied inputs. These processor functions operate therefore to handle processing associated with more complicated gates in the system under test while the less complicated gates are processed by the 8 function table units within the gate processing unit system 230.

A pair of cross bar network systems 250 and 252 are provided and associated with the undefined state table 220 and the defined state table 210, respectively. These corresponding networks are used to allow simulation units to interact with one another based on larger networks which have signals representing gate levels crossing between processing modules. All of this is accomplished using the data bus system comprising the four data buses 254, 256, 258 and 260 within the processor module. The serial/parallel link control system 270 is connected between the functional processing units 240 and 242 to control operation of those functional processing units and to aid in running of the simulation of multiple cycle sequences of a system under test. The functional processing units 240 and 242 in addition to being connected to the data buses 254, 256, 258 and 260 are also provided with interconnections on buses 272, associated with functional processing unit 242 and bus 274 associated with functional processing unit 240 to registers 276 and 278 associated, respectively with the defined state table and the undefined state table 210 and 220, respectively. These registers provide data input to these defined and undefined state tables to provide the alternation, as required, between the functional processing unit inputs to these tables from the gate function table or gate processing unit input to these state tables.

Referring now to FIG. 3, showing a further embodiment 299 of the invention, an event simulator data flow block diagram is shown. In simulator system 301, the logical data and the timing data necessary to verify the operation of a logical network is analyzed. The preprocessing of data must take place in a host processor 301 to generate inputs to fan out table 300 which distributes information on "net list" destination, gate types and gate labels. This information is stored, for example, in a 32K by 40 bit memory 300. Other information which is necessary for the simulation to progress is the specific delay information for operation of each type of gate or device simulated. This information is stored in the gate output table 302, which is a 16K by 40 bit memory in this embodiment. Other data which is required is the data on the logical states of each gate and this data is placed in the state table 304. This table is a 48K by 20 bit memory in this embodiment. Definition of the logical operation of the various types of gates is stored in the logical model table 306 which is a 16K by 40 bit memory in this embodiment. Once the preprocessor 12 has loaded the tables previously discussed then the simulation process goes under the control of the event time scheduler 308. The event time scheduler 308 would then direct the activity of the hardware in the fan out table 300, the gate output table 302, the state table 304, the logical model table 300, and a logic evaluation processor 310. These memories and logical processors would be coordinated such that data was moved between them as dictated by the event time scheduler such that logical state changes and timing events are kept track of to show what happens to each gate output for any given increment of time during logical operation.

Figure 4A:
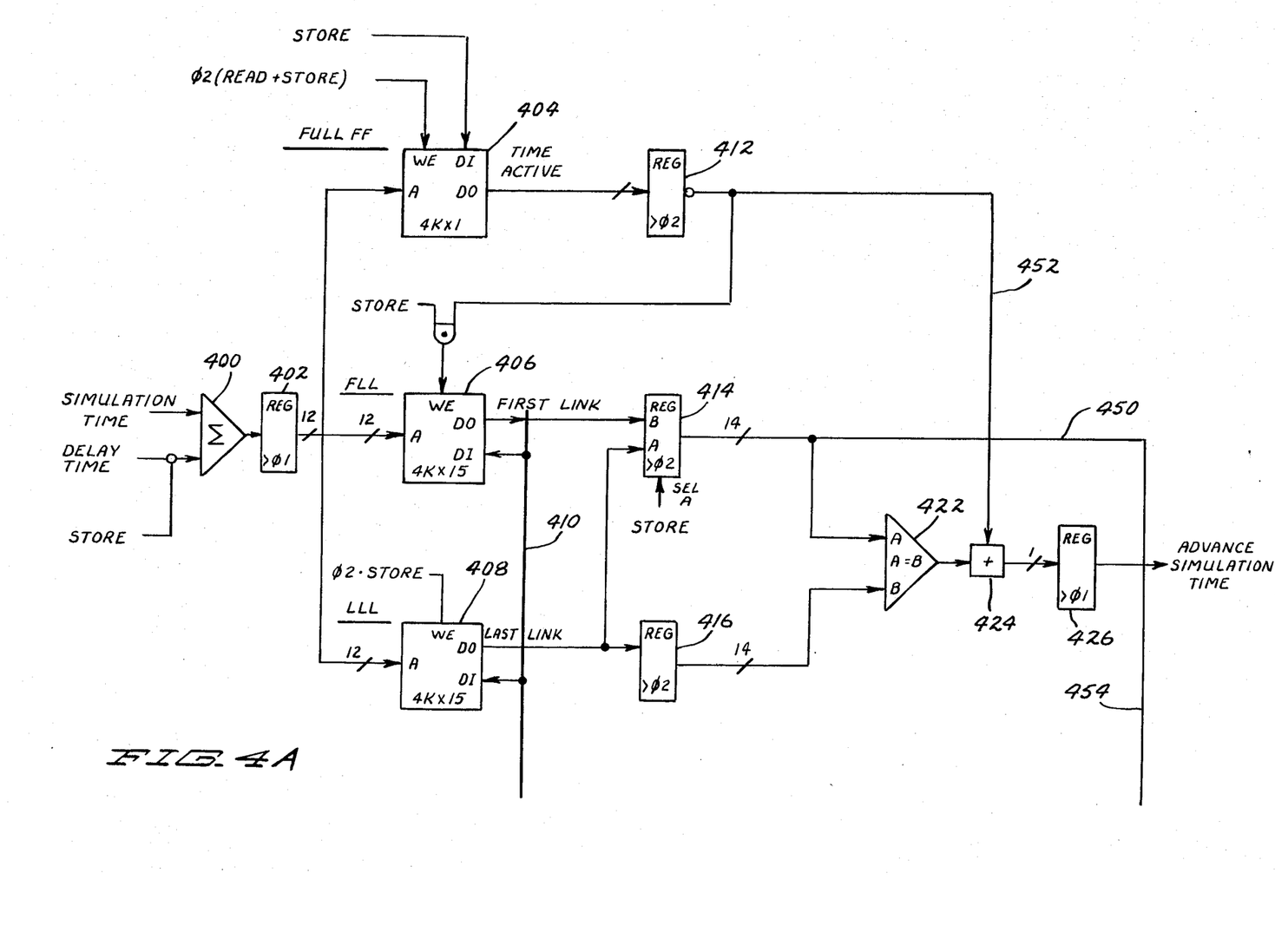
FIGS. 4A and 4B are intended to be placed in top and bottom relationship, respectively, and show certain elements of the simulator system shown in FIG. 3.
Figure 4B:
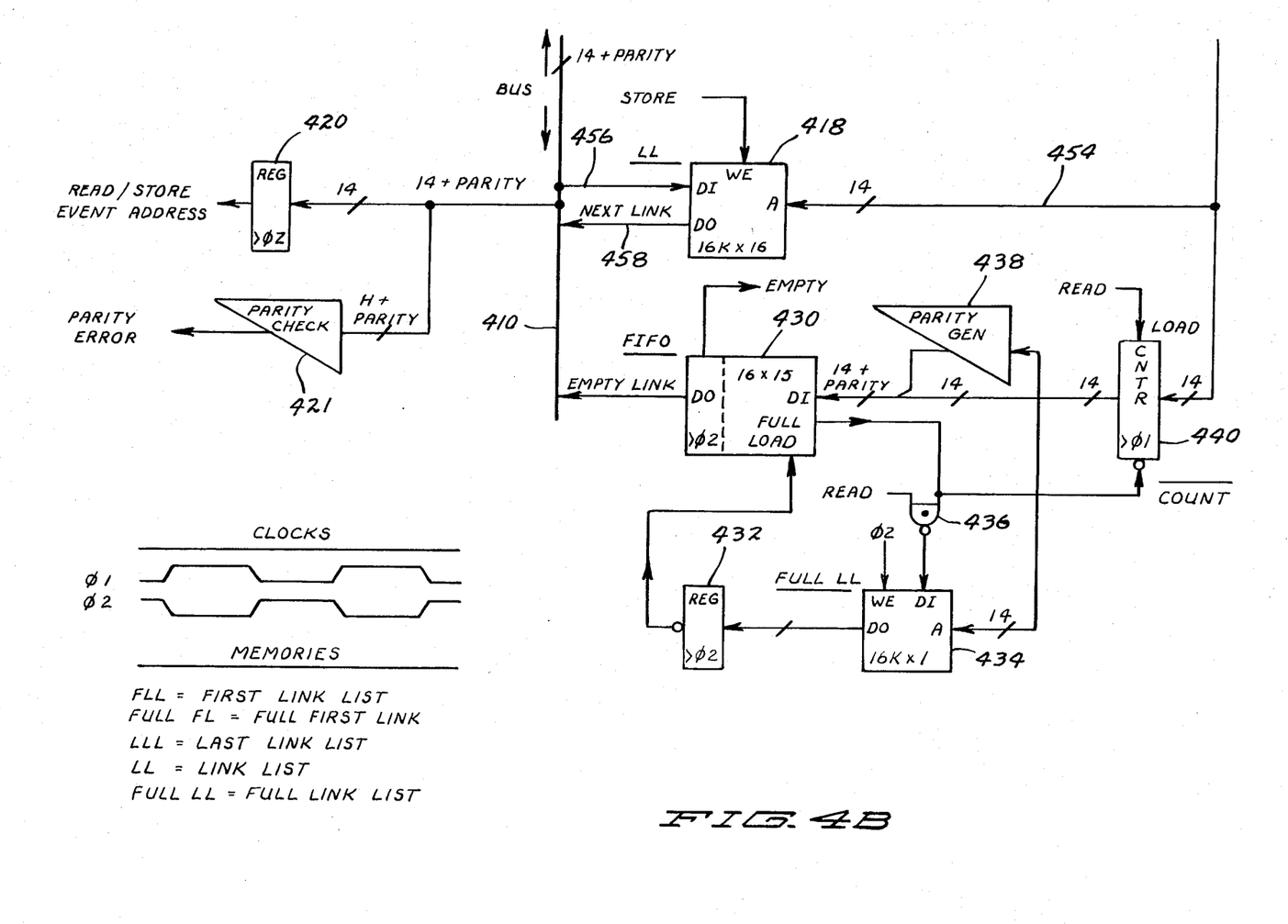
Figure 8A:
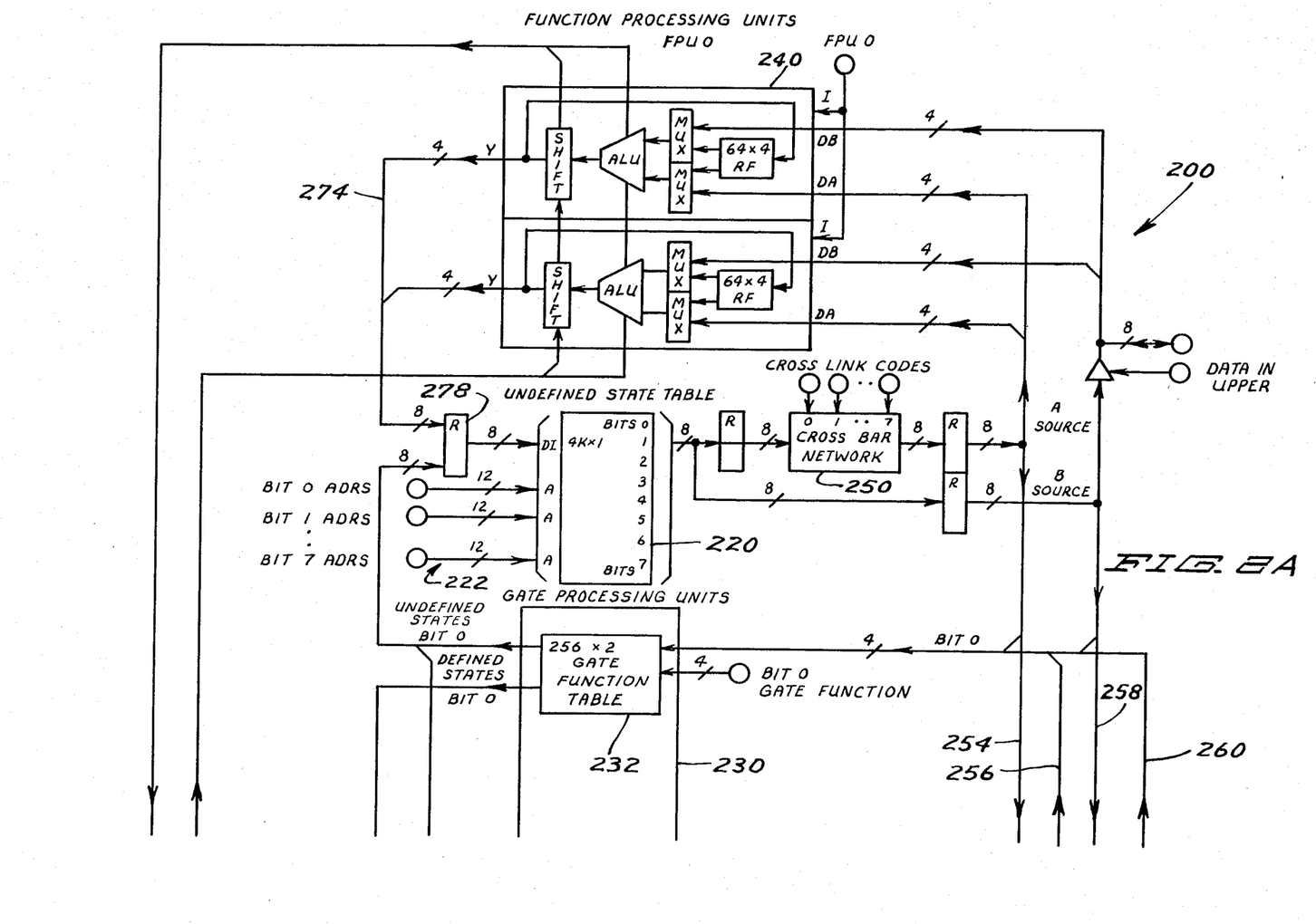
Figure 9:
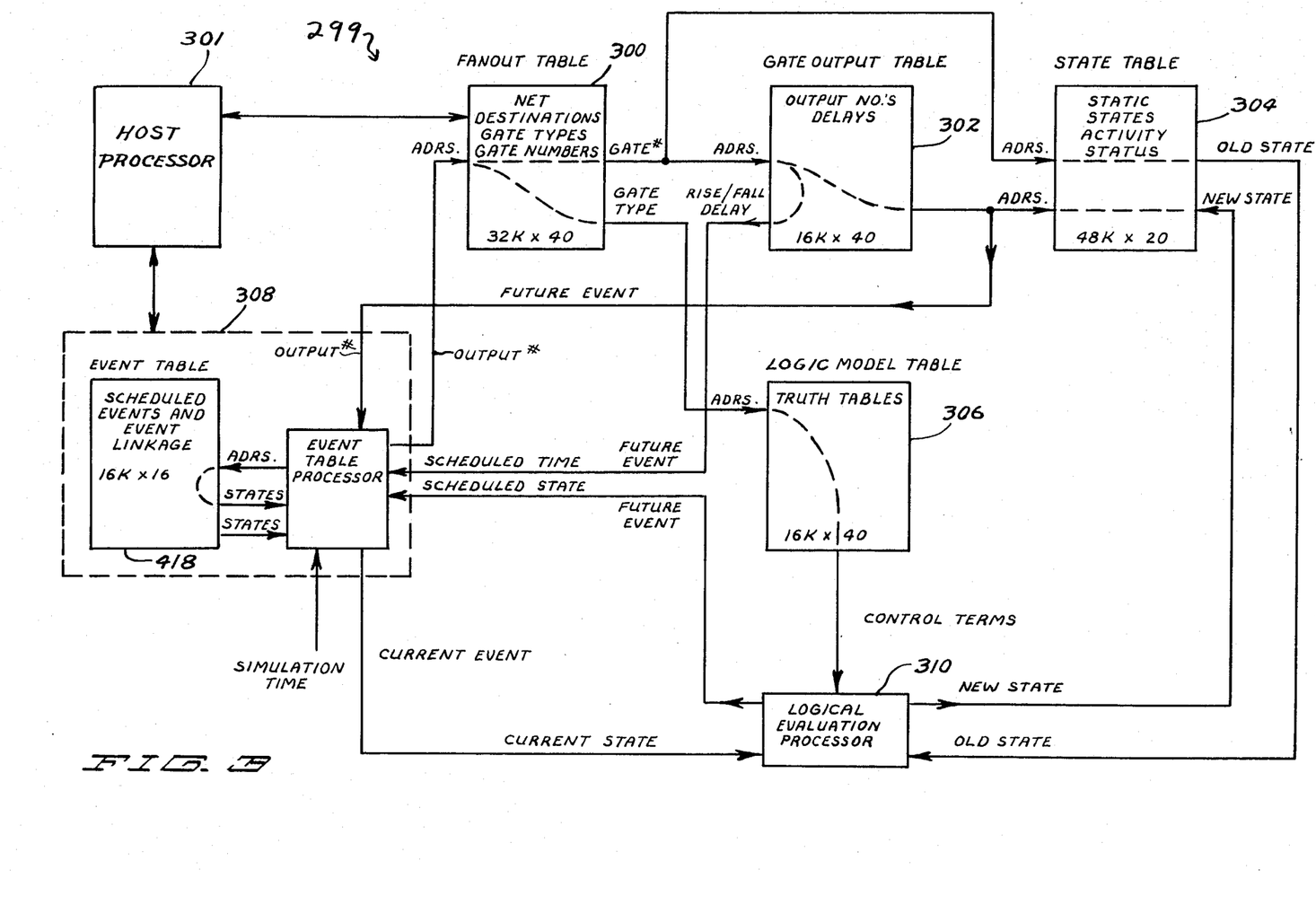

The event time scheduler 308 is detailed further in FIG. 4. FIG. 4 illustrates some of the control logic and memories necessary to implement the scheduling of events and the linking of these events in time.

The purpose of the event time scheduler link list approach shown in FIG. 3 is to allow random allocation of memory which is required to keep track of the number of logic state changes for any given period of time. The link list memories can store, as an example, five state changes at one simulation time and link and keep track of those. At the next simulation time period, it can control a different number of state changes say 100 and it would store these state changes and link them in the link list memories. This would be repeated then for any number of state changes at any given simulation time period thereby dynamically allocating memory to hold all of the state changes at all of the times under consideration during any given simulation run.

Once a given logic diagram design has been simulated, the results of the updated state tables are sent to a post processor function which then translates the data into human recognizable form which can then be given to either a print output or a graphics terminal to allow the logic designer the ability to observe the results of the simulation test.

Referring still to FIG. 3, the event table 418 is the 16K by 16 bit memory in event time scheduler 308 that is used to store events that are to be processed. The system is built around the event table in that the algorithm will fetch an event from memory, process the event and determine if new events are to be generated. The function of event time scheduler 308 is to fetch an event. Devices 300, 302, 304, 306, and 310 are to process the event and determine if any new events are going to be generated and stored back in the event table 418 for processing at a later time.

When an event is fetched out of the event table, the current events are evaluated. The current event and the current state are processed. Logical evaluator processor 310 is used to first process the event to obtain the current state and store the input state for the simulated gate. The state is stored in the word which is addressed for a particular model table gate. The new logical output of a gate is evaluated and processor 310 uses model table 306, which is a truth table, to obtain required model information for a gate type.

After the new state is stored for a gate, the input pins for the gate will be used to address the truth table and to determine a new state for the gate. For example, if you have a four way AND gate and there are four input pins to the AND gate, the event coming in might change the state of one of the inputs to the AND gate. A truth table will be used to evaluate the new output of the gate and, for this gate type, there will be a new output corresponding to the input states of the gate. Once the gate output is evaluated using processor 310 and table 306, if there is a change of state on the output of the gate, then it is determined where the gate output fans out so that the state or event can be propagated to the other gates or new loads on that gate output. Table 306 determines if there is a state output change. If there is a state output change, the state is propagated to the other gates. Fan-out table 300 matches destination gate types and gate numbers. This is equivalent to the interconnect list for the gate output table 302 which has the delays. When an event occurs, it requires that the state is stored so the state table is held in state table 304. State table 304 is where the input and output states of all the pins on a gate are held. When a new event changes the input pin to a gate, thus changing the state of the input pin, that state will be held in state table 304. A new event has the new pin state stored in state table 304. The pin states in table 304 are matched with the gate type to determine the reference to the truth table in model table 306 to determine what the new output state of the gate will be. The old state stored in table 304 and the new state determined from the truth table in model table 306 are used to determine if the output of the gate has changed. If the output state of the gate has changed then the fanout table 300, which is the interconnect list, and the output table 302 which is the output delays, are used to determine the new events to go to the loads on the gate. These new events drive the input pins of loads to which the gate is connected.

Referring now to FIG. 4, which shows the detail of the event time scheduler 308 shown on FIG. 3, a simulation time summation device 400 receives information relating to the simulation time presently under consideration. Simulation time summation device 400 is connected to register 402. Register 402 provides output to a full first link list memory 404, a first link last memory 406 and a last link list memory 408. The full first link meory 404 is connected to a register 412 which has an output bus 452 connected to an OR gate 424. The output bus 452 is also connected as one input to an OR gate connected to the write enable control on first link list memory 406. Both the first link list memory 406 and the last link list memory 408 are connected to data bus 410, as will be described later, connected to other elements within the system. Register 14 operates as a first link register and is connected to the bus 410. Register 414 has an output which is connected on a bus 450 as an input to comparator 422 and as an input to counter 440. Last link register 416 is connected to last link memory 408 and provides the second input to comparator 422. Comparator 422 provides the comparison as to when the link list registers 414 and 416 contain the same link list address and provide an output to OR gate 424. When OR gate 424 is made, the link list address is passed into register 426 which provides an output to advance simulation time one increment for further processing. A link list memory 418 is connected with a data input and a data output to bus 410. Link list memory 418 is controlled by an input from bus 450. A first-in-first-out memory 430 is connected with bus 410 to preserve empty link information. A register 432 is connected from a full link list memory 434 to memory 430. A parity generator operates on data operating from the full list memory 434 to the first-in-first-out memory 430. An OR gate 436 controls the operation of full link list memory 434. A counter 440 provides a data input to the first-in-first-out memory 430 while the output which is the empty link output address is connected on to the data bus 410.

The event storage memory 418 and may be a 16K by 16 bit memory that is used to store events. Events common to a given sample time are stored in 6 blocks of 16 words so that the memory which is 16K by 16 bits is logically broken up into blocks of 16 words. The devices 404, 406, 408, are memories that are useed to control the addressing of the 16K by 16 bit memory 418. Full first link memory 404 is a 14K by 1 bit memory. Memory 404 is used to determine if there is an active sample time. A clock cycle could be broken up into a maximum of 4,096 sampling times and the state of the sample time is stored in the 4K by 1 bit memory.

Register 402 is used to bring in the current sample time and an address into memory 404 which is the memory which tells whether this sample time is active or not. If the sample time is active, events are read from an event time schedule. For each sample time, an address passes through memories 400 and 402 to fill address block memory 404, if the bit in memory 404 for this address is set and the sample time is active. If the sample time is active, the address is then sent to memories 406 and 408. Memory 406 contains a pointer into the first 16 word block of memory containing events. Memory 408 contains a pointer into the last 16 word block of memory containing events. Devices 404, 406, 410, 414, 416, 422, 424 and 426 keep track of the event blocks into which the block contains 16 events and devices 456, 434 and 436 are used to access individual events stored within a block. The block diagram of FIG. 4A is primarily used to keep track of the addressing of the individual blocks. Memory 418 is used to store events. Events are stored in blocks of 16 words so there are 1,024 blocks stored in memory 418, in this embodiment. Each block has 16 words in it. The blocks may have a variable size. They can contain anywhere from 1 word up to 16 words, so memory can be partitioned into 1,024 blocks of 16 words or anywhere up to 16,384 blocks of 1 word, depending upon the type of simulation encountered. The block size may be changed to enhance performance. The larger block will give enhanced performance. Each time a block is emptied the first link pointer will be incremented. The first link pointer will be incremented and blocks will be read until the first link pointer is equal to the last link pointer. Device 422 is used to compare the first link and last link pointers. When the comparison is made all the blocks have been read.

Memory is partitioned into blocks and the first link pointer in device 406 will point to the first block that is to be read. The last link pointer in device 408 will point to the last block that is to read. As the blocks are read, the first link pointer will be incremented and compared in device 422 to the last link pointer. When the comparison in device 424 indicates that the pointers are equal, the simulation is advanced to a time which is the output of device 426.

It is to be understood that in each situation where the output state conditions for a first gate that are to be provided as inputs to a second gate are not changed so that the second gate sees no changed inputs, then the system does not address the second gate in the next state of the simulation to determine if that gate has changed states. In other words, the system according to the present invention provides for a great deal of efficiency by only performing the simulation steps on gates or circuit elements having changed input conditions of some sort. Since, the large number of cycles, into which each time step of the design to be simulated is divided, provides for only a few gates changing state at each step, therefore, a chip having many thousands of gates can be analyzed much more efficiently than if each of the thousands of gates had to be addressed at each cycle of the operation. Thus, it is a key feature of the present invention that for each cycle time of operation representing a sample time of the chip under test, only gates having pointers indicating a change in input status need to be evaluated for a change in state. This allows for addressing only a comparatively few of all of the gates in the device to be simulated.

Thus, the present system provides that events common to the current sample time are removed from the appropriate memory and are then operated on by the logic units in the system. New events which are generated as a result of processing are placed back into storage memory after the processing operation. The system of storing events, according to the present invention, is important. Events are stored in linked lists, having common sample times. That is, the lists of events are linked by the common sample time. In processing a simulation program on a general purpose computer, significant computer time is exacted in finding, linking, and arranging events in common sample times. The present invention stores events in blocks or linked lists so that the lists may be addressed in sequential order as described in connection with FIG. 4 for the particular sample time in operation. In order to process gate events, the new input pin state of the gate is received from memory and sampled so that the new output pin state can be evaluated through processing. Any new output pin state is stored back into memory. Gates having no output state change are removed from the sample because they present no new input pin state to the next gate in sequence. Thus, the next gate in sequence need not be evaluated in the next time sequence of the simulation. The new events which are generated by the system may be scattered across many sample times in the future based on the gate delay times involved. Thus, for the event storage, events resulting from the new event determination must be stored in various memory locations corresponding to the gate delay for the affected gate in sequence according to the "net list" of the system.

Therefore, one of the advantages of the present invention is that the simulation hardware is able to adapt at each sample time of processing to have a different number of state changes per cycle of sample time rather than a fixed number of state changes per sample time. The dynamic allocation of memory for different numbers of state changes per simulation run is an important feature of the present invention in connection with memory control. In addition, since the design of the present invention in the embodiments of either FIGS. 1A and 1B or FIGS. 3, 4A, and 4B is that the modular design allows for external state control information to alter during operation at each sample time the state control or the state function of particular gates in the simulation sample. Thus, to simulate a chip of a given size, various simulators of a predetermined standard size may be grouped together under control of the host processor where the results of one or more of the simulators is fed to other simulators to control the state of various gates that are present in the "net list" of that simulator. This dynamic ability to alter the state of particular gates at particular sample times through external information is an important feature of the present invention.

What is claimed is:

1. A logic simulator apparatus for verifying the design of logic devices having a plurality of circuit elements by simulating the characteristics of the circuit elements comprising in combination:

a host computer processor for reading data into the apparatus and for reading data out of the apparatus, a "net list" memory connected to receive and transmit data from said host processor for receiving data relating to the circuit elements of the logic device under test, a model table memory for containing information describing the logical function of all circuit elements in the logic design to be verified, a first register for reading the contents of said "net list" memory and said model table memory, said first register being connected to receive data from said "net list" memory and said model table memory, a second register connected to receive data from said first register, a state table memory connected to receive data from said second register for said "net list" and said model table, a module ring control for providing and receiving external state table information under control of said host processor, said module ring control being connected to control said second register, said module ring control controlling said second register to provide change of state table information for said state table memory from other logic devices under test and under control of said host processor, a logical evaluator connected to receive and transmit data from said state table memory for using said "net list" information and said model table information to generate a new state table information for the logical elements of the logic design to be verified, said logical evaluator providing a return input to said state table memory to replace old state table information with new state table information in said state table memory at each simulation sample time where each simulation sample time interval is shorter than the time interval of operation of any logic device under test, a net list address register connected to and for controlling said "net list" memory, and a memory and clock control for controlling the operation of said apparatus to operate at a predetermined number of simulation sample times within one logical cycle of said logic system design to be verified wherein said "net list" memory contains the current state of particular logical elements and wherein said model table memory contains information regarding the operation of particular logical elements and wherein said state table memory and said logical evaluator evaluates the state of logical elements having a changed input at each sample time and does not evaluate the change in state for logical elements not receiving a change in input at the particular sample time and wherein said memory and clock control is responsive to said module ring control to receive an input from or provide an input to said module ring control for external devices at appropriate times within said logical cycle.

2. An apparatus for simulating the logical design of logic chips or networks having a plurality of logic elements by simulating the characteristics of the logic elements comprising in combination:

a fanout table memory connected to receive and transmit data from a host processor for holding "net list" information, gate logical design information and gate interconnection information for logic elements to be simulated, a logical event time scheduler connected to receive data from said fanout table for receiving input information about said logical design and for providing output information about changes in state in the logical elements of said logic design, a logical evaluation processor for performing the logical functions of particular logic elements in the logic design to be verified, said logical evaluation processor connected to said event time scheduler for receiving information about the current state of particular logical elements and for providing information about changes in state in particular logical elements, a gate output table memory connected to receive data from said fanout table memory for receiving information about logical elements at a particular sample time and the logical elements to which said elements pass changes in state at future sample times, a state table memory connected to receive data from said fanout table memory and said gate output table memory for holding information about the old state of a logical element and the new state of a logical element which replaces the old state of the logical element, said state table memory being connected to receive data from said logical evaluation processor which provides information about said new states of logical elements, a logical model table memory connected to receive data from said fanout table memory for holding information about the logical function performed by logical elements and for receiving data relating to the logical element under consideration from said fanout table memory and connected to transmit data to said logical evaluation processor for providing data relating to the logical function to be performed on the logical element under test at a particular sample time, and wherein said apparatus performs operations on logical elements at particular predetermined sample times under test where said sample times are at intervals much shorter than operation cycle time of the simulated logic elements and provides information about changes in state to logical elements connected to the elements under test and when for each sample time cycle and apparatus only performs logical evaluation steps on logical elements receiving changes in input as a result of changes in state of logical elements from an earlier sample time and does not perform any logical evaluation function on logical elements not receiving a change in input change from a logical element from an earlier sample time.

3. The apparatus of claim 2 wherein said logical evaluation processor is comprised of:

a simulation time status register, a full first link first memory connected to transmit and receive data from said simulation time status register, a first link list status second memory connected to transmit and receive data from said simulation time status register, a last link list third memory connected to transmit and receive data from said simulation time register, first, second and third registers connected to transmit and receive data from said first, second and third memories, a comparator connected to receive data from said second and third register which produces an output when said first link list second memory is addressed by the same address as said last link list third memory, and an OR gate connected to receive data from the output of said comparator and with said first register for receiving information about said full first link first memory wherein when said address comparator is at the last address of a simulation time the address simulation time is advanced to the next simulation sample time in sequence.

4. The apparatus of claim 3 and further comprising a bus interconnecting said second and third memories, a last link memory connected with said bus for identifying the next link address for the next simulation time of said apparatus, a first-in first-out memory for identifying an empty link address connected with said bus, and a control device for controlling said last link memory and said first-in first-out memory.

5. The apparatus of claim 2 in which said apparatus is connected to transmit and receive data from other similar apparatus to receive change of state information on inputs to logical elements contained in said "net list" memory at various cycles of sample time and further comprising an input device for providing a second input from an external source to said second register and to said module ring control for controlling said second register to receive an input from the external source at appropriate times in the sample cycle.

* * * * *

UNITED STATES PATENT AND TRADEMARK OFFICE
CERTIFICATE OF CORRECTION

PATENT NO. : 4,527,249

DATED : July 2, 1985

INVENTOR(S) : Van Brunt

It is certified that error appears in the above-identified patent and that said Letters Patent is hereby corrected as shown below:

Col. 2, line 17: "maufacturing" should read --manufacturing--;

Col. 7, line 19: "intermediate" should read --intermodule--;

Col. 10, line 32: "meory" should read --memory--;

Col. 10, line 43: "last link memory" should read --last link list memory--;

Col. 10, line 58: "full list" should read --full link list--;

Col. 11, line 1: "useed" should read --used--;

Col. 11, line 22: insert --which-- between "block" and "contains";

Col. 11, line 56: "next state" should read --next stage--;

Col. 14, line 45: "operation cycle time" should read --operation cycle times--;

Col. 14, line 49: "and apparatus" should read --said apparatus--; and

Col. 14, line 55: "input change" should read --input state--.

Signed and Sealed this

First Day of April 1986

[SEAL]

Attest:

DONALD J. QUIGG

Attesting Officer        Commissioner of Patents and Trademarks